(12) United States Patent
Hake et al.

(10) Patent No.: US 12,215,017 B2
(45) Date of Patent: Feb. 4, 2025

(54) VIBRATION SENSOR

(71) Applicant: The Regents of the University of Michigan, Ann Arbor, MI (US)

(72) Inventors: Alison Hake, Ann Arbor, MI (US); Karl Grosh, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 450 days.

(21) Appl. No.: 17/611,541

(22) PCT Filed: May 14, 2020

(86) PCT No.: PCT/US2020/032914
§ 371 (c)(1),
(2) Date: Nov. 15, 2021

(87) PCT Pub. No.: WO2020/232259
PCT Pub. Date: Nov. 19, 2020

(65) Prior Publication Data
US 2022/0212918 A1   Jul. 7, 2022

Related U.S. Application Data

(60) Provisional application No. 62/848,430, filed on May 15, 2019.

(51) Int. Cl.
*B81B 3/00*   (2006.01)
*H10N 30/20*  (2023.01)
(Continued)

(52) U.S. Cl.
CPC ......... *B81B 3/0018* (2013.01); *H10N 30/204* (2023.02); *H10N 30/872* (2023.02); *B81B 2201/0285* (2013.01); *H04R 17/10* (2013.01)

(58) Field of Classification Search
CPC ......... B81B 3/0018; B81B 2201/0285; H10N 30/204; H10N 30/872; H04R 17/10
See application file for complete search history.

(56) References Cited

U.S. PATENT DOCUMENTS 6,012,334 A * 1/2000 Ando ............... G01H 3/08
                                                   73/648
6,223,601 B1   5/2001 Harada et al.
(Continued)

FOREIGN PATENT DOCUMENTS

KR   1020160005542 A   1/2016

OTHER PUBLICATIONS

International Search Report corresponding to International Application No. PCT/US2020/032914, dated Aug. 28, 2020, 3 pages.
(Continued)

*Primary Examiner* — David Vu
*Assistant Examiner* — Brandon C Fox
(74) *Attorney, Agent, or Firm* — Reising Ethington P.C.

(57) ABSTRACT

A sensor, such as a piezoelectric MEMS vibration sensor, includes a frame, a beam array comprising a plurality of beams, and a plurality of masses. Each beam of the plurality of beams has an anchored end and an unanchored end, with each beam being coupled to the frame at the anchored end. The unanchored end of each beam is coupled to a respective mass of the plurality of masses. Each beam of the plurality of beams can be configured to minimize a variation in a voltage output for a limited frequency range. In some implementations, the resonant frequency of each beam corresponds to a sensitivity peak in a limited frequency range.

13 Claims, 12 Drawing Sheets

(51) Int. Cl.
*H10N 30/87* (2023.01)
*H04R 17/10* (2006.01)

(56) References Cited

U.S. PATENT DOCUMENTS

| | | | |
|---|---|---|---|
| 7,944,130 B2* | 5/2011 | Park | B81B 7/04 |
| | | | 310/317 |
| 2010/0064813 A1 | 3/2010 | Nishizawa et al. | |
| 2016/0003669 A1 | 1/2016 | Lee et al. | |
| 2017/0307437 A1 | 10/2017 | Staehle-Bouliane et al. | |
| 2018/0038901 A1* | 2/2018 | Kim | G01R 23/16 |
| 2018/0097506 A1* | 4/2018 | Kang | H03H 9/24 |
| 2018/0131347 A1* | 5/2018 | Rhee | H03H 9/02259 |
| 2018/0275156 A1* | 9/2018 | Ernst | G01P 1/127 |
| 2018/0283935 A1 | 10/2018 | Kanda | |
| 2021/0126615 A1* | 4/2021 | Yoon | H03H 9/02259 |

OTHER PUBLICATIONS

Written Opinion corresponding to International Application No. PCT/US2020/032914, dated Aug. 28, 2020, 5 pages.

\* cited by examiner

VIBRATION SENSOR

GOVERNMENT FUNDING

This invention was made with government support under DGE1256260 awarded by the National Science Foundation. The government has certain rights in the invention.

FIELD

This invention relates generally to sensors, and more particularly, to piezoelectric micro-electro-mechanical system (MEMS) vibration sensors.

BACKGROUND

Piezoelectric MEMS vibration sensors can be used in a wide array of applications, such as consumer electronics, activity trackers, or biomedical devices, to cite a few examples. In one particular example, a piezoelectric MEMS vibration sensor can be used in an auditory prosthetic device. Only about 20% of people who could benefit from a hearing aid use one. This low uptake could be due to issues relating to appearance, discomfort, and technical issues (e.g., acoustic feedback and poor performance in noisy environments). With many cochlear implants, the external processor must be removed during sleeping, bathing, or exercise. Completely implantable systems, on the other hand, would use natural outer ear and ear canal function, and would be able to provide more realistic representations of natural hearing. However, some implantable systems involve undesirable disarticulation of the ossicular chain, or their sensor performance is impacted by tissue variation. Thus, complete implantation without irreversible alteration of the ossicular chain is desirable. Additionally, with most piezoelectric MEMS vibration sensors, including those used for auditory prostheses, it is desirable to achieve an appropriately high sensitivity over a wide frequency range.

SUMMARY

According to one embodiment, there is provided a sensor, comprising: a frame; a beam array con a plurality of beams; and a plurality of masses. Each beam of the plurality of beams has an anchored end and an unanchored end. Each beam is coupled to the frame at the anchored end. The unanchored end of each bears is coupled to a respective mass of the plurality of masses.

According to various implementations, the sensor may further include the following features or any technically-feasible combination of some or all of these features:
  the beam array has a xylophonic shape;
  each mass has a mass thickness, and each mass thickness has a xylophonic variation that corresponds to the xylophonic shape of the beam array;
  each beam includes a cantilevered bimorph multi-layer structure;
  one or more beams of the plurality of beams includes an exposed body portion that is located between an electrode and the respective mass;
  a size of each mass of the plurality of masses correlates with a length of each beam of the plurality of beams;
  a center of gravity for each mass in the plurality of masses is vertically aligned with a neutral axis, lies above the neutral axis, or lies below the neutral axis of each beam of the plurality of beams;
  each beam of the plurality of beams is configured to minimize a variation in a voltage sensitivity for a limited frequency range;
  each beam of the plurality of beams has a resonant frequency, and the resonant frequency of each beam corresponds to a sensitivity peak in a limited frequency range; and/or
  two or more beams of the plurality of beams have different resonant frequencies.

According to another embodiment, there is provided a sensor, comprising: a frame and a beam array comprising a plurality of beams. Each beam of the plurality of beams is configured to minimize a variation in a voltage output for a limited frequency range.

According to various implementations, the sensor may further include the following features or any technically-feasible combination of some or all of these features:
  each beam of the plurality of beams has an anchored end and an unanchored end, wherein each beam is coupled to the frame at the anchored end and a mass is coupled to each beam of the plurality of beams at the unanchored end; and/or
  each beam of the plurality of beams has a resonant frequency, and wherein the resonant frequency of each beam corresponds to a sensitivity peak in the limited frequency range.

According to another embodiment, there is provided a sensor, comprising: a frame and a beam array comprising a plurality of beams. Each beam of the plurality of beams has a resonant frequency, wherein the resonant frequency of each beam corresponds to a sensitivity peak in a limited frequency range.

According to various implementations, the sensor may further include the following features or any technically-feasible combination of some or all of these features:
  each beam of the plurality of beams has an anchored end and an unanchored end, wherein each beam is coupled to the frame at the anchored end and a mass is coupled to each beam of the plurality of beams at the unanchored end; and/or
  each beam of the plurality of beams is configured to minimize a variation in a voltage sensitivity for the limited frequency range.

According to another embodiment, there is provided a sensor, comprising: a frame and a beam array comprising a plurality of beams. Two or more beams of the plurality of beams have different resonant frequencies.

According to various implementations, the sensor may further include the following features or any technically-feasible combination of some or all of these features:
  each beam of the plurality of beams has an anchored end and an unanchored end, wherein each beam is coupled to the frame at the anchored end and a mass is coupled to each beam of the plurality of beams at the unanchored end;
  each beam of the plurality of beams has a resonant frequency and the resonant frequency of each beam corresponds to a sensitivity peak in a limited frequency range; and/or
  each beam of the plurality of beams is configured to minimize a variation in a voltage sensitivity for a limited frequency range

DRAWINGS

Example embodiments will hereinafter be described in conjunction with the appended drawings, wherein like designations denote like elements, and wherein.

Figure 6:
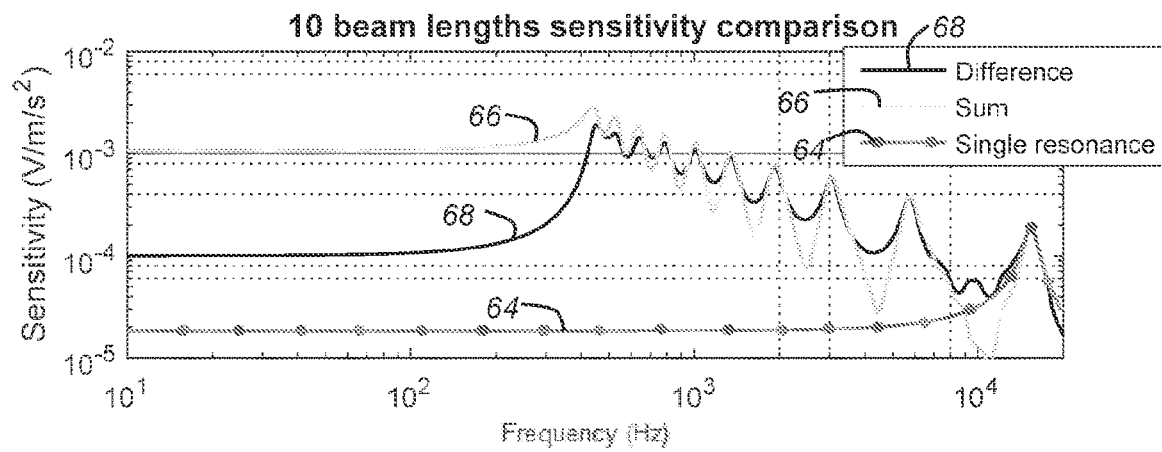
Figure 7:
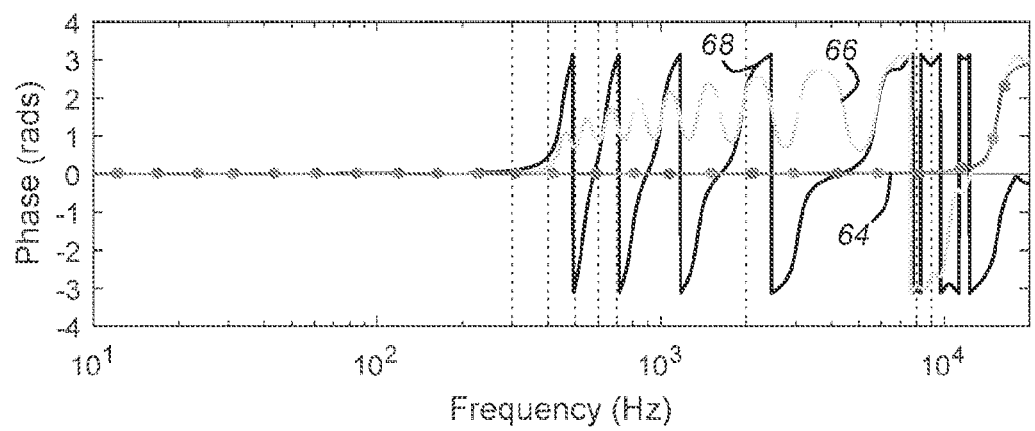
Figure 8:
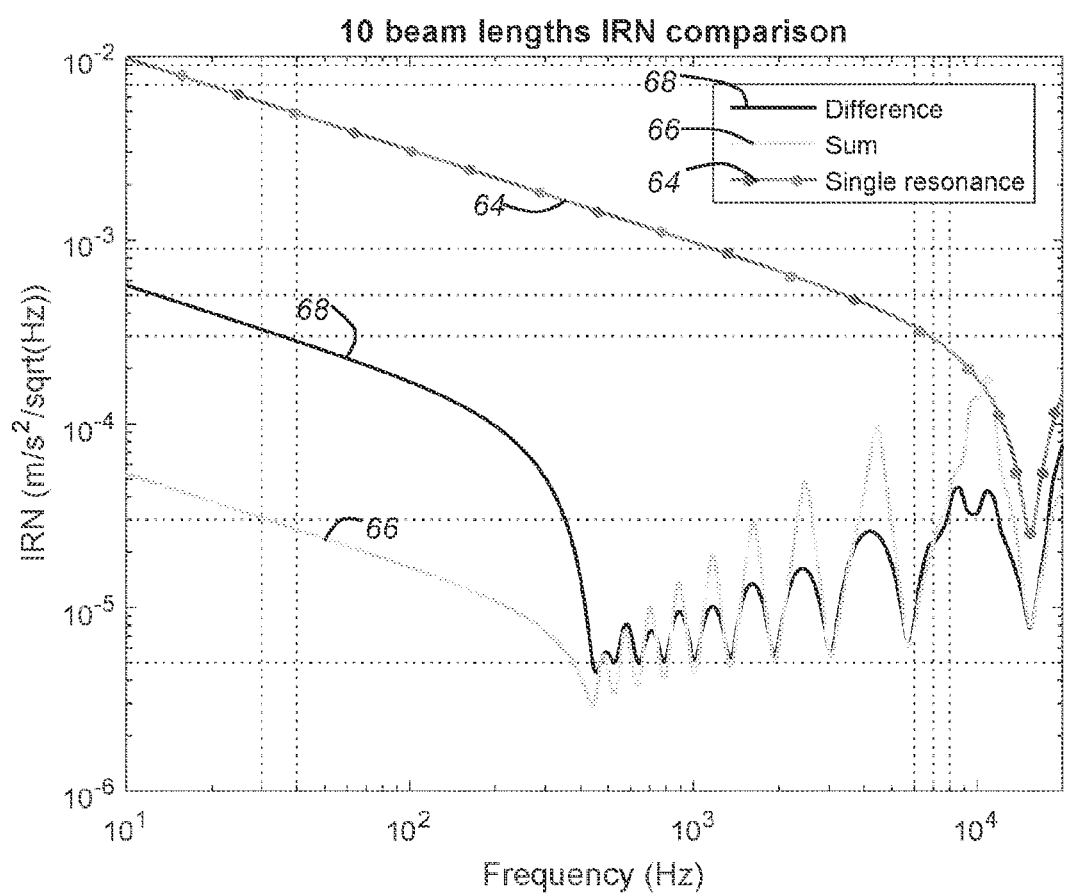
Figure 9:
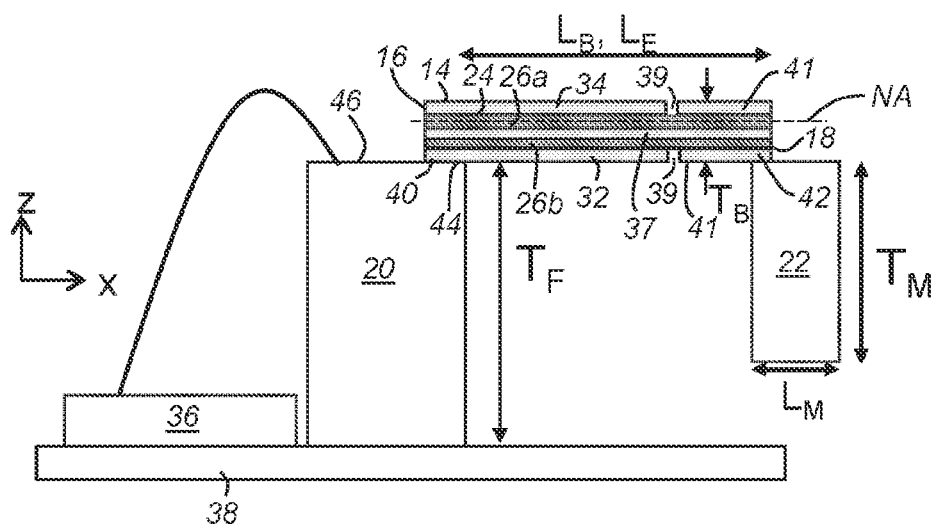
Figure 10:
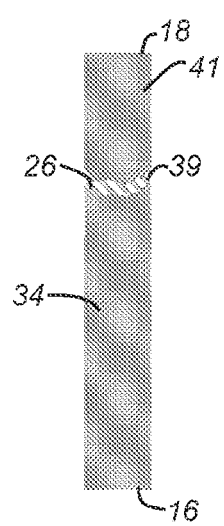
Figure 11:
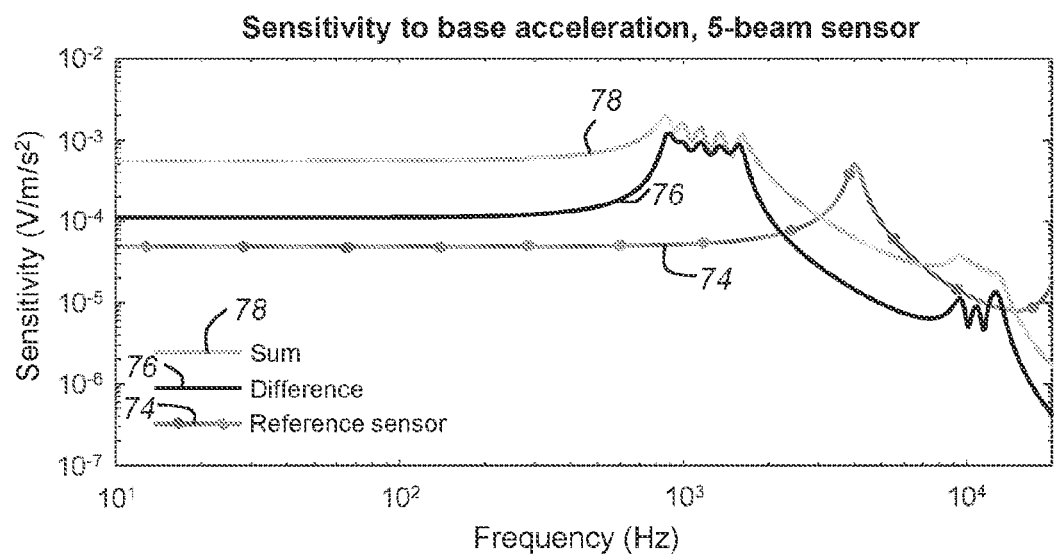
Figure 12:
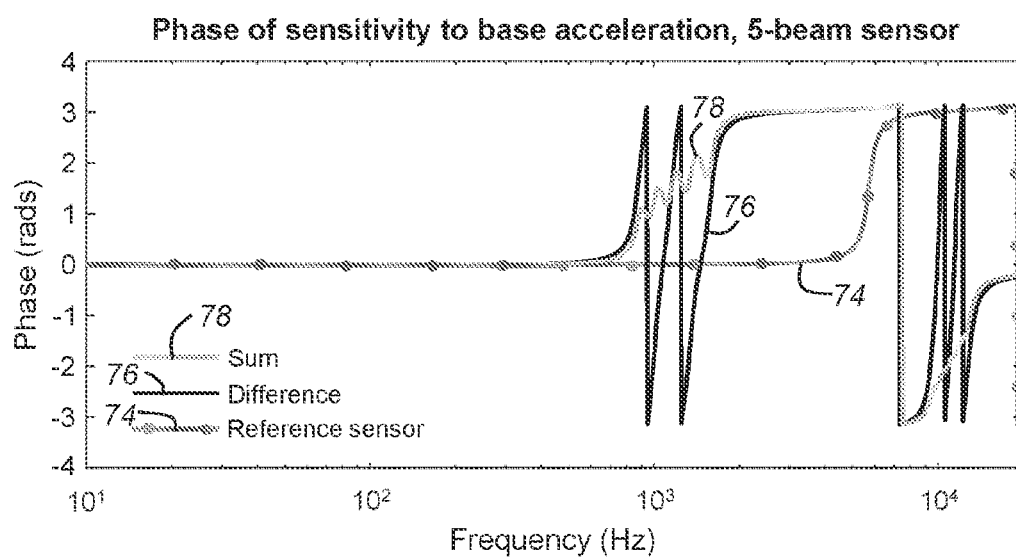
Figure 13:
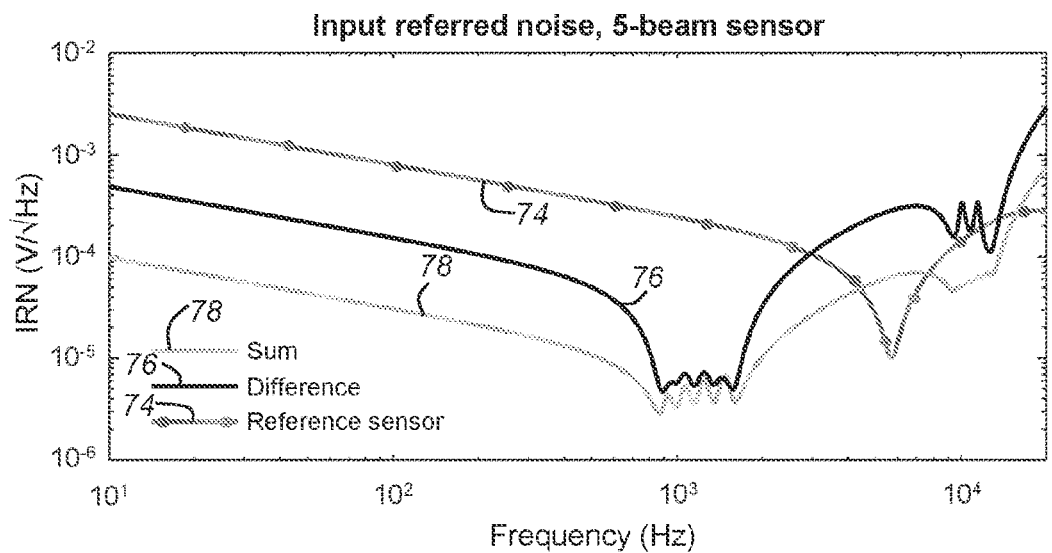
Figure 14:
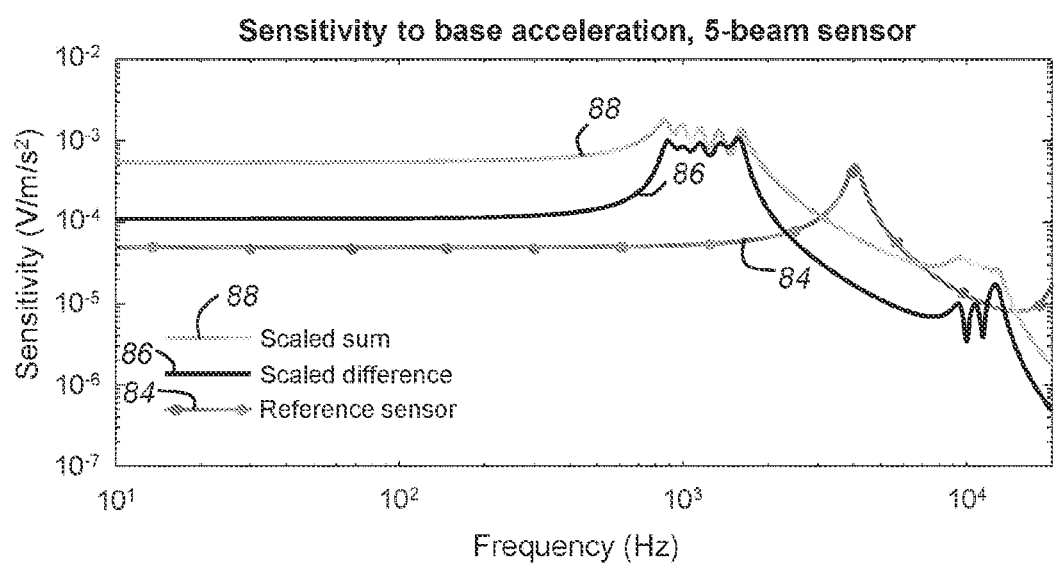
Figure 15:
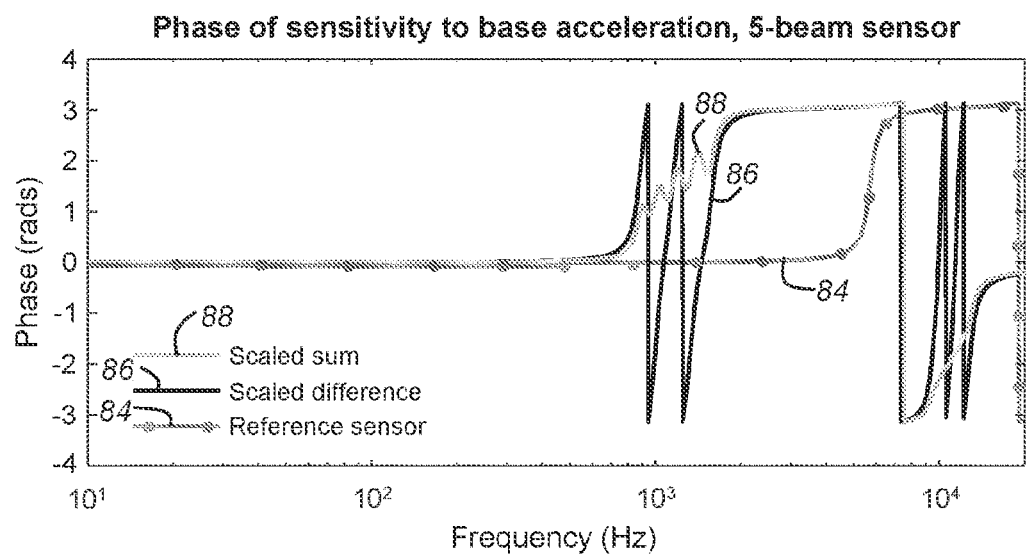
Figure 16:
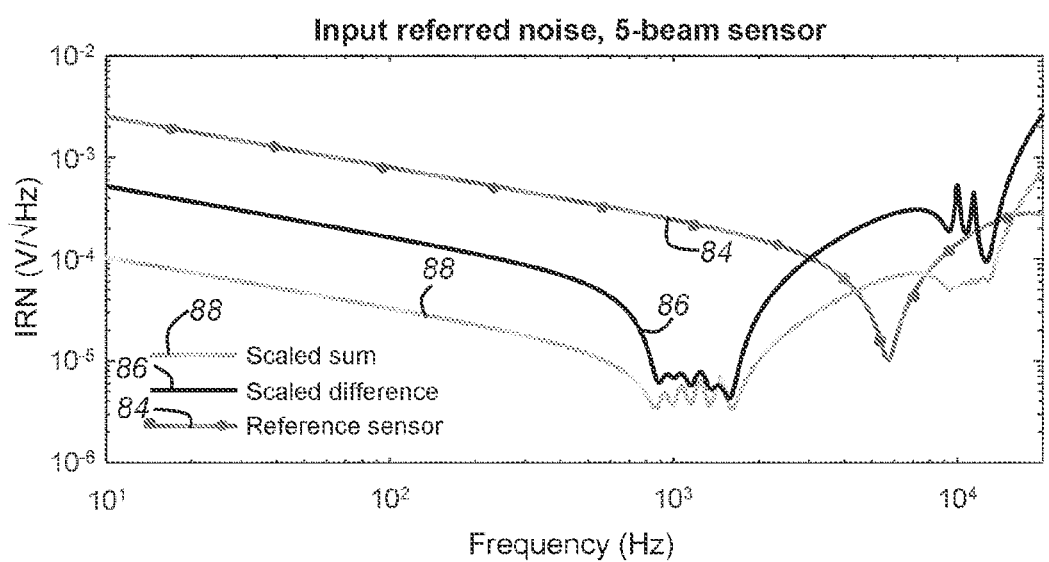

FIGS. 6-8 graphically represent comparisons between a single-resonance MEMS sensor and two embodiments of a multi-resonant MEMS sensor, with FIG. 6 comparing sensitivity, FIG. 7 comparing phase, and FIG. 8 comparing input referred noise; and FIG. 9 is cross-section, schematic representation of a sensor in accordance with another embodiment;

FIG. 10 is a top view of the top electrode from the sensor of FIG. 9;

FIGS. 11-13 graphically represent comparisons between a reference MEMS sensor and two embodiments of a multi-resonant MEMS sensor, with FIG. 11 comparing sensitivity, FIG. 12 comparing phase, and FIG. 13 comparing input referred noise; and FIGS. 14-16 graphically represent comparisons between a reference MEMS sensor and two other embodiments of a multi-resonant MEMS sensor, with FIG. 14 comparing sensitivity, FIG. 15 comparing phase, and FIG. 16 comparing input referred noise.

DESCRIPTION

A piezoelectric MEMS vibration sensor is described herein that is capable of achieving an appropriately high sensitivity over a wide frequency range, so as to satisfy certain input referred noise (IRN) design limits, which are typically application dependent. In one particular application, the MEMS sensor is used as an implantable, multi-resonant accelerometer fir an auditory prosthetic device. However, other implementations and applications are certainly possible, including but not limited to, sensors for consumer electronics, other biomedical devices, activity trackers, or other applications where vibration sensing is useful. The MEMS sensor described herein includes a beam array comprising a plurality of beans, each beam having an anchored end attached to a frame and an unanchored end attached to a mass. The MEMS sensor is a multi-resonant vibration sensor having particular beam and electrode structures, as well as particularly numbered and/or dimensioned beam-mass pairs, that tailor the magnitude and smoothness of the voltage output over a desired range of frequencies.

Figure 1:
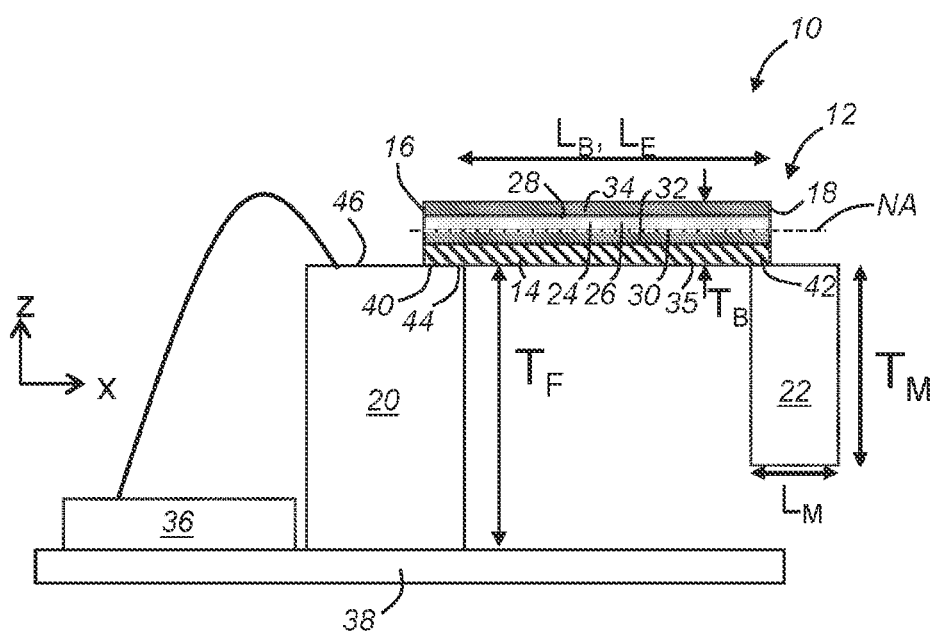
FIG. 1 is a cross-section, schematic representation of a sensor in accordance with one embodiment.

FIG. 1 is a cross-section, schematic representation of a sensor 10. The sensor 10 is a multi-resonant MEMS vibration sensor. The sensor 10 includes a beam array 12 having a plurality of beams 14 (only one beam 14 is shown in the cross-section schematic of FIG. 1). Each beam 14 includes an anchored end 16 and an unanchored end 18. The anchored end 16 is a portion of the beam 14 that is secured or otherwise attached to a frame 20, and the unanchored end 18 includes a mass 22. Advantageously, each beam 14 includes a multi-layer structure 24. The multi-layer structure 24 includes a body 26, which is advantageously a piezoelectric body 26 having a top side 28 and a bottom side 30. A first electrode 32 is situated on the bottom side 30 of the body 26, and a second electrode 34 is situated on the top side 28 of the body 26. This embodiment of the multi-layer structure 24 also includes a passive substrate layer 35; however, the multi-layer structure 24 may be different than what is illustrated, as shown in the alternate, example embodiment illustrated in FIG. 9. Various electronics 36 can be used to connect the beam array 12, via the frame 20, to a printed circuit board (PCB) 38. The electronics 36 can include any operable components such as transistors, amplifiers, etc., and will most likely depend on the desired application for the sensor 10. The PCB 38 can be attached to a protective package (sealing the MEMS sensor 10 inside this package) and the transducer can be sensitive to the motion of the PCB in either the transverse or in plane direction.

Figure 2:
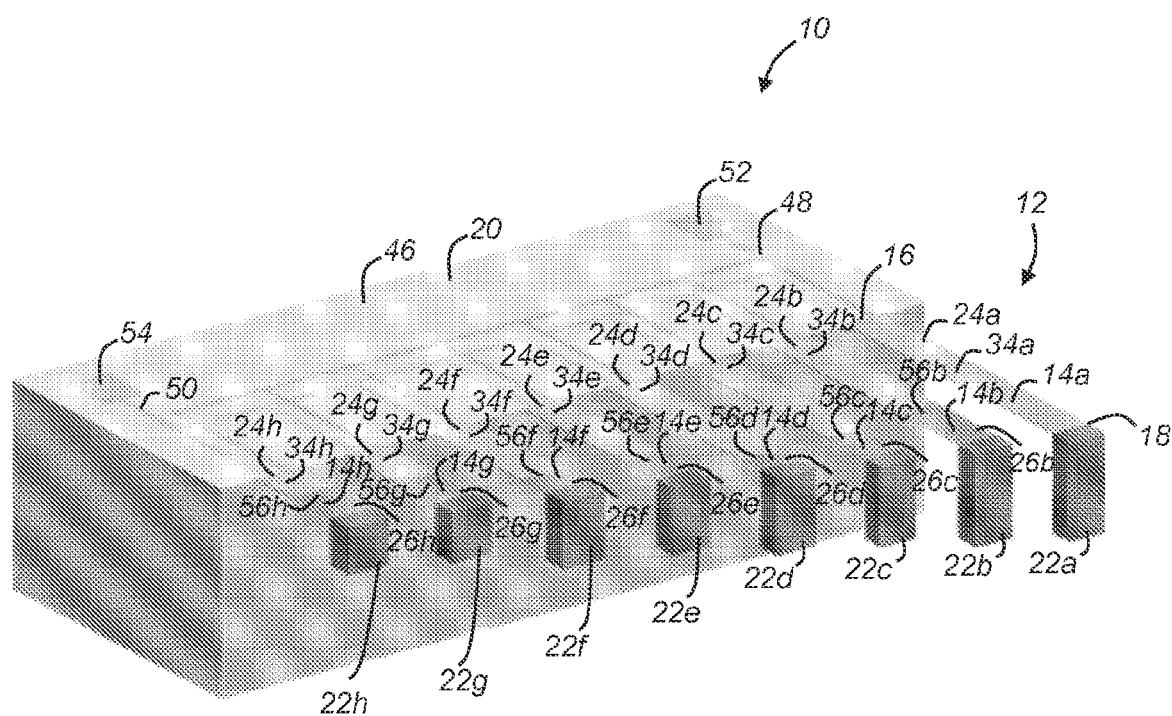
FIG. 2 is a perspective view of a sensor in accordance with another embodiment.

FIG. 2 shows one example of a beam array 12 that is structured to provide a multi-resonant sensor 10. In the illustrated embodiment, the beam array 12 has a xylophonic shape, wherein the beam 14a is the longest, and each beam 14b-14h gets progressively shorter in length. The change in beam length ($L_B$ as shown in FIG. 1) between the beams 14a-14h may be exponential (see e.g., FIG. 3), or it may be linear (see e.g., FIG. 4). The xylophonic variation in beam length $L_B$ can help provide the sensor 10 with multi-resonant performance, as will be detailed further below. In some embodiments, the beam array 12 may not follow the xylophonic variation, as the mix in beam length $L_B$ may be more randomized than the ascending/descending arrangement shown. For example, the beam array 12 can include one or more long beams followed by one or more shorter beams, then followed by one or more additional longer beams.

Each beam 14 is a single, physically isolated beam that is electrically interconnected with the other beams in the array 12 to produce the overall sensor 10 having desired sensitivity characteristics. Each beam 14 may have a straight, rectangular shape as shown. In other embodiments, the beams 14 may have some other operable shape. The beam thickness $T_B$ can range from 0.5 microns to 8 microns, inclusive, to cite one example range; however, the thickness may be different and will likely depend on a number of factors, including the materials for the various layers 26, 32, 34, the manufacturing technique, etc. Further, although the layers 26, 32, 34 are schematically illustrated as having the same or a similar thickness, it is possible for this to vary (e.g., the body 26 may be the thickest or thinnest layer, with the electrodes 32, 34 having a different thickness than the body 26). Advantageously, the piezoelectric body 26 is manufactured to be as thin as possible (e.g., approximately 0.5 microns) while maintaining good piezoelectric film quality. While the sensor 10 includes advantageous variations in beam length $L_B$, the thickness $T_B$ of the beams 14 is generally the same front beam to beam, given the desired manufacturing/patterning method.

Figure 3:
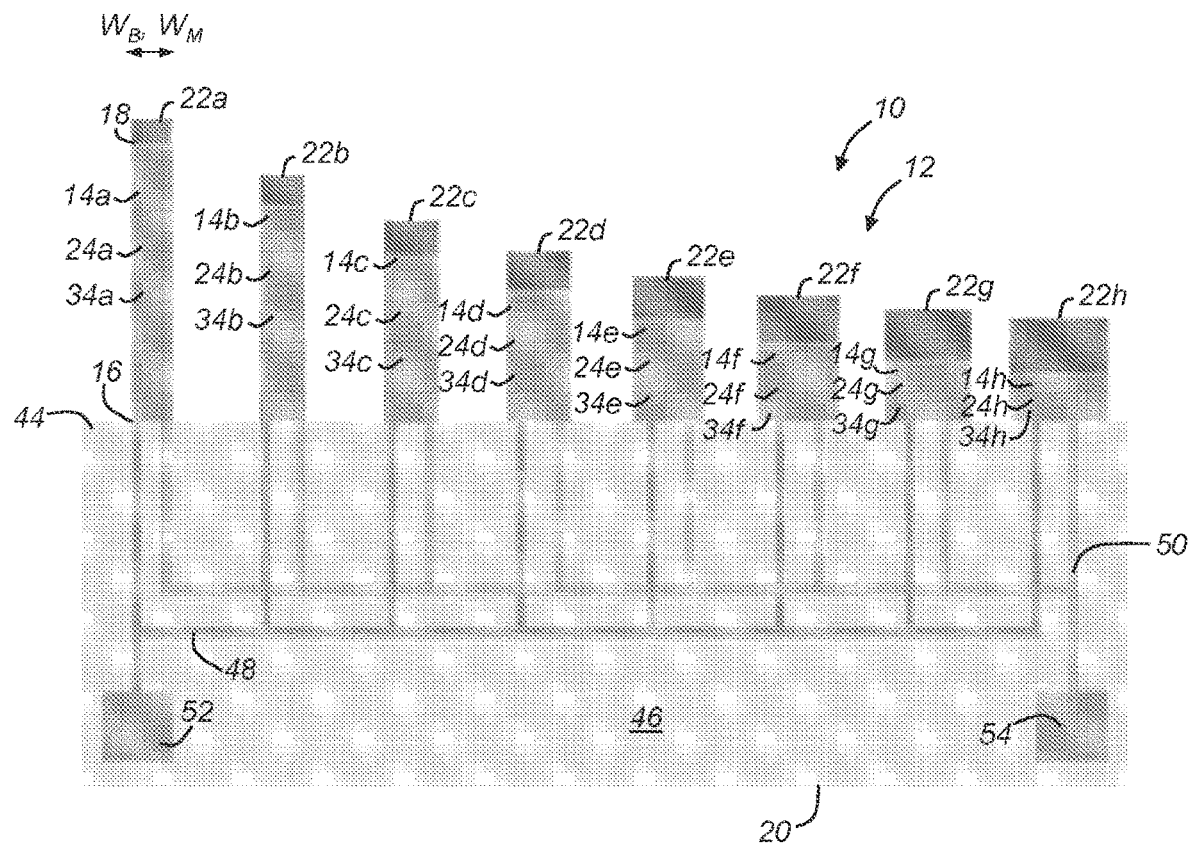
FIG. 3 is a top view of a sensor in accordance with another embodiment.
Figure 4:
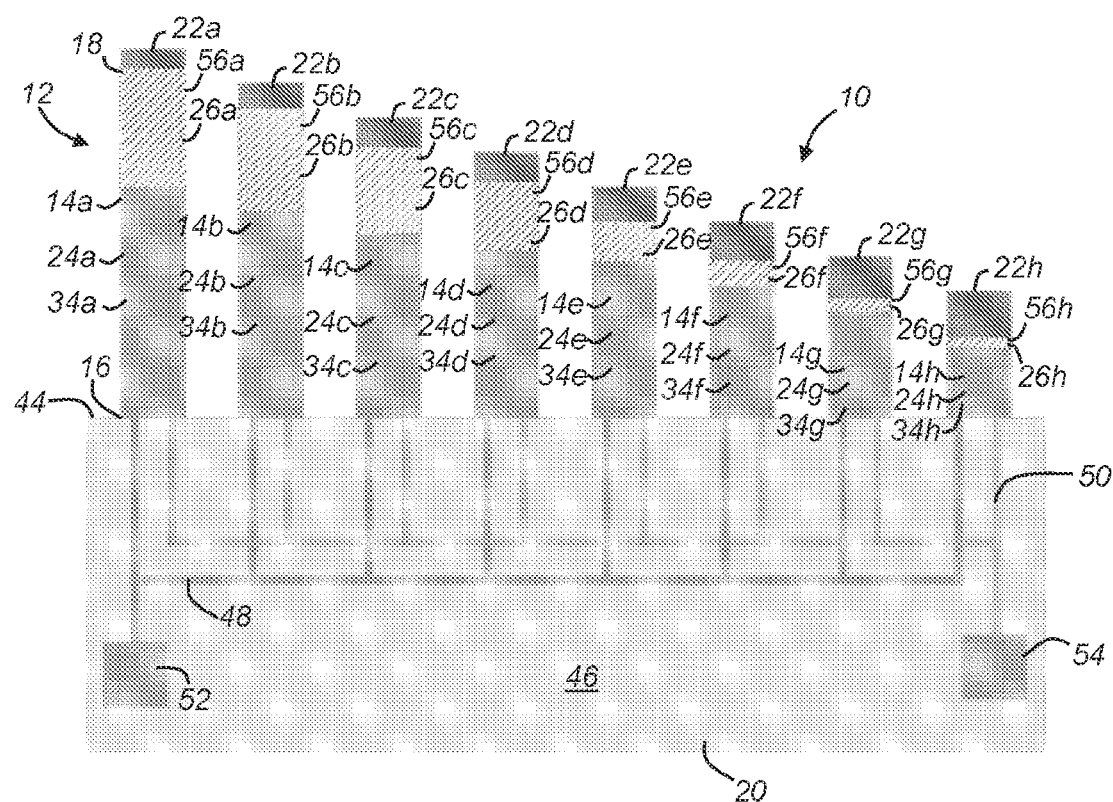
FIG. 4 is a top view of a sensor in accordance with yet another embodiment.

The beams 14 each include an anchored end 16 and an unanchored end 18 (in FIGS. 2-4, only one beam 14a, is labeled to show the anchored end 16 and unanchored end 18 for clarity purposes). The anchored end 16 is coupled to the frame 20, and the unanchored end 18 is coupled to a separate mass 22. As shown more particularly in FIG. 1, the anchored end 16 can include an overlap area 40 that at least partially overlaps the frame 20. Similarly, the unanchored end 18 can include an overlap area 42 that at least partially overlaps the mass 22. The overlap areas 40, 42 may be also included in the other embodiments, although they are not particularly illustrated in the other figures and often will comprise the entire area on top of the mass 20 and nearly all of the upper surface area of the frame 20. The overlap areas 40, 42 may be a product of the manufacturing process, such as a deep reactive ion etching (DRIE) process. The size of the overlap areas 40, 42 may be greater than what is schematically illustrated in FIG. 1 as well. For example, the overlap area 40, 42 can make up all or a greater proportion of the top area or surface of the frame 20 and/or mass 22, respectively. In the embodiments illustrated in FIGS. 2-4, the anchored ends 16 of each beam 14 are generally aligned with respect to an edge portion 44 of the frame 20. The unanchored ends 18 are advantageously not aligned, and instead can follow the xylophonic variation of the beam array 12.

The frame 20 and a mass 22 are coupled with the anchored end 16 and the unanchored end 18, respectively, of each beam 14. The frame 20 and each mass 22 are advantageously portions of an etched silicon substrate; however, other materials are certainly possible. The frame 20 is situated between the beam array 12 and the PCB 38, and it serves as the main structural support for the beam array 12. The dimensions of the frame 20 will vary depending on the desired application for the sensor 10. The frame 20 has a connection surface 46 that includes patterned electrical connections 48, 50 with associated output pads 52, 54 for connecting to the other electronics 36. The electrical connections 48, 50 can be series, parallel, or some combination of both series and parallel. In some embodiments, inversion of the signal can be used to obtain the sum and/or difference of voltage outputs from the individual beams 14. Thus, the electrical connections 48, 50 can provide final corrections to the output voltage of the sensor 10 by connecting the plurality of beams 14 in series and/or in parallel, as well as determining which outputs are summed and which are differenced. For example, the sensor 10 can achieve better sensitivity by summing the outputs, but it may be advantageous in other embodiments to vary which outputs are summed and which are differenced. In other embodiments, each beam's output could be digitally sampled by the electrical readout circuitry and then digitally added or subtracted over different frequency ranges, depending on the application.

Each mass 22 is a proof mass attached at the unanchored end 18 of each beam 14. The mass 22 helps dictate the resonant frequency of each beam 14, and accordingly, the size and shape of each mass 22 can be tailored to achieve a desired resonant frequency response. With reference to FIG. 1, each mass 22 has a length $L_M$ and thickness $T_M$. These dimensions may be chosen to impact the frequency response of the beam 14. In some embodiments, the size of the mass 22 may correlate with the length $L_B$ of each beam 14, such that larger masses (whether by length, thickness, some combination thereof, etc.) are included with longer beams and smaller masses are included with shorter beams. An example of this embodiment is shown with respect to the beam array 12 shown in FIG. 2. In this embodiment, the relative mass thicknesses $T_M$ have the same xylophonic variation as the size of the beams 14 themselves, in that the thickness $T_M$ of each mass 22 increases as the beam length $L_B$ increases. To help ensure adequate sensor performance, each mass 22 has a thickness $T_M$ that is less than a thickness $T_F$ of the frame 20. It may be helpful to align the center of mass of each proof mass 22 to the point where it connects at the unanchored end 18 to the neutral axis NA of each beam 14. The location of the neutral axis NA is somewhere within the beam 14, and will depend on the material properties of the beam and the layers that make up the beam. For example, in FIG. 1, the neutral axis NA depends on the thickness of the passive substrate 35 and piezoelectric body 26.

Advantageously, each mass 22 has a width $W_M$ that coincides with the width of the beam $W_B$, as designated, for example, in the top view of FIG. 3. As with the length $L_M$ and thickness $T_M$, it is possible for the mass width $W_M$ to vary from beam to beam to impact the resonant frequency response. In the FIG. 3 embodiment, the width $W_M$ of each mass increases as the length $L_B$ of each beam 14 decreases. Given the varying widths $W_M$ in FIG. 3, this also impacts the spacing between beams. For example, the spacing between beams 14a and 14b is greater than the spacing between any of the other beam pairs, such as beams 14g and 14h. In the FIG. 4 embodiment, the width $W_M$ of each mass stays constant, but the length $L_M$ of each mass 22 increases as the beam length $L_B$ decreases. In this embodiment, the spacing between beams 14 is constant. Varying the width of the beams $W_B$ can change the capacitance of each beam 14.

Each beam 14 includes a multi-layer structure 24. The multi-layer structure 24 may be a cantilevered bimorph or a cantilevered multimorph. A cantilevered bimorph multi-layer structure 24 can be advantageous, as the bending of each bimorph structure produces a measurable voltage that can be used to determine displacement or acceleration, and cantilevering can reduce the influence of material residual stress on the device bandwidth. A bimorph consisting of two piezoelectric layers (see FIG. 9 having two piezoelectric body layers 26a, 26b), would also have three electrode layers, such that it further includes a middle electrode layer 37, while a bimorph with one piezoelectric body layer 26 and one passive substrate 35 (see FIG. 1) would have four total layers (one piezoelectric, one passive substrate, and two electrodes). The multi-layer structure 24 generally includes a piezoelectric body 26 that is at least partially located between the first electrode 32 and the second electrode 34. The multi-layer structure 24 may have more layers than what is particularly illustrated in the figures. The multi-layer structure 24 may also include one or more layers having a different functionality than the illustrated layers, such as spacer layers and/or shielding layers (e.g., a parylene layer, a silicon dioxide layer, etc.). To those practiced in the art, it is known that there will be a trade-off between the location of the neutral axis NA of the beam 14, sensitivity, and noise. The neutral axis NA will occur somewhere between the upper and lower surfaces of the multi-layer structure 24.

The body 26 of the multi-layer structure 24 comprises a piezoelectric material. In one example embodiment, the piezoelectric material is aluminum nitride (AlN), and in an even more particular embodiment, the piezoelectric material is a scandium-doped AlN. The use of scandium-doped AlN may be advantageous because it can help increase sensitivity of the sensor 10 without overly increasing the IRN. Other piezoelectric materials are certainly possible, including but not limited to lead zirconate titanate (PZT), zinc oxide (ZnO), polyvinylidene fluoride (PVDF), or $Pb(Mg_{1/3}Nb_{2/3})O_3$—$PbTiO_3$ (PMN-PT). While the piezoelectric body 26 is illustrated as stopping directly at the edge portion 44 of the frame 20, if the sensor 10 is patterned, the body layer may extend further across the frame and/or the substrate, as it may not be necessary to etch off the material on inactive areas. The piezoelectric body 26, at least in the cantilevered beam area, can be fully sandwiched or covered by each of the first and second electrode layers 32, 34, as shown in the beam 14a in FIG. 2 or in all of the beams 14 in FIG. 3. Alternatively, the first and/or second electrode layers 32, 34 may only partially cover the piezoelectric body 26.

A first electrode 32 is situated on the bottom side 30 of the body 26, and a second electrode 34 is situated on the top side 28 of the body 26. Each electrode 32, 34 in the illustrated embodiments is patterned or deposited on or beneath the piezoelectric body 26. A metal-based material such as molybdenum can advantageously be used for the electrodes 32, 34, or another operable material such as platinum or aluminum, to cite a few examples. As shown in FIG. 2, the amount of electrode coverage (defined at least partially by the electrode length $L_E$) can be chosen for a particular capacitance and voltage output. Accordingly, the embodiments illustrated in FIGS. 2 and 4 have an exposed body portion 56 that is located between the first and/or second electrode 32, 34 and the mass 22. The size of the exposed body portion 56 may vary in no particular order, as shown in FIG. 2. However, in FIG. 4, the length of the exposed body portion 56 decreases exponentially from 56a-56h, and the length of each exposed body portion 56 generally tracks the xylophonic distribution of the beam array 12 (e.g., ascending/descending). For example, the exponential decrease in the electrode length $L_E$ shown in FIG. 4, however, occurs when the beam length $L_B$ decreases linearly. In some embodiments, the beam length $L_B$ and the electrode length $L_E$ both decrease exponentially, or both decrease linearly. In yet another embodiment, the beam length $L_B$ may decrease exponentially while the electrode length $L_E$ decreases linearly.

Instead of the structure of the exposed body portion 56 schematically illustrated in FIGS. 2 and 4, it is possible, and likely in many embodiments, that except for a break portion 39, as shown in FIGS. 9 and 10, the entire flexible body layer 26 of the piezoelectric material 26 would be covered by the metal electrode 34, although some portion of the beam 14 may be uncovered. This leaves a floating electrode portion 41. At the anchored end 16, electrical vias connect the electrodes 32, 34, 37 to the traces 48, 50 which then go to respective pads 52, 54. The middle electrode 37, which is included in this embodiment of the multi-layer structure 24, is typically not broken (i.e., does not include break portion 39), and is continuous. The teachings with respect to the exposed body portion 56 may also be applicable to the floating electrode portion 41. It is also possible to have a break portion that extends along the length of the beam 14 (e.g., generally orthogonal to the break portion 39 illustrated in FIG. 10).

Figure 5:
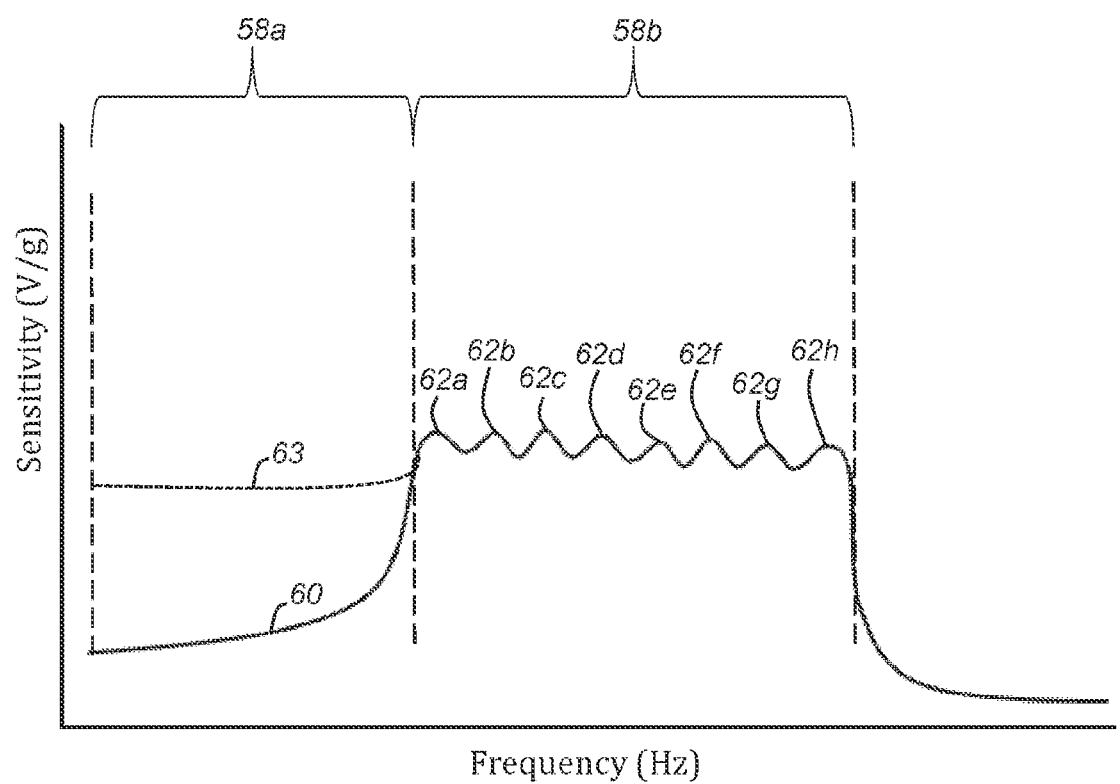
FIG. 5 is a graph of sensitivity with respect to frequency for a desired outcome of an embodiment.

The components and structure of the beam array 12 are chosen to help improve the low-frequency IRN of the multi-resonant sensor 10. It is desirable to have an appropriately high sensitivity over a wide frequency range so as to achieve certain IRN design limits for particular applications. FIG. 5 graphically illustrates example sensitivity with respect to frequency. There are two scenarios, the first is where the resonant region serves to extend the low frequency sensitivity region (58a, which traditionally ends at the resonance of the sensor, as discussed later with regard to a single resonance case 64). The second is when a bandpass region is created over the resonant frequency range (58b). The limited frequency range could be both 58a and 58b (together discussed as just 58, with 58a representing a below resonance sensitivity and 58b representing a resonance region sensitivity), or just one or the other. It is possible to increase the sensitivity in the range 58a, as seen in FIG. 6 and represented by dotted line 63, depending on whether the signals are summed or differenced. This can cause a higher or lower sensitivity in the range 58a, and thus it may be possible to take advantage of the sensitivity in the low frequency range 58a. It can be advantageous to try and make the sensitivity in the region 58a the same or within some percentage of the sensitivity in the region 58b. In some embodiments, each beam 14a-14h is configured such that its resonant frequency corresponds to a sensitivity peak 62a-62h in the range 58b. More particularly, the beam 14a shown in FIG. 2 can be configured to have a resonant frequency corresponding to the sensitivity peak 62a, the beam 14b can be configured to have a resonant frequency corresponding to the sensitivity peak 62b, etc.

The frequency range 58 will depend on a number of factors, one of the prominent factors being the desired application for the multi-resonant MEMS sensor 10. In an auditory prosthesis accelerometer, the limited frequency range in one example is about 100 Hz to 8 kHz. Also, as detailed above, the limited frequency range 58 may also be chosen based on the magnitude or presence of sensitivity variation. Other factors may be used to help dictate the scope of the frequency range needed to achieve the particular IRN design limits or resolution for the desired application. In some embodiments, beam array 12 is configured to minimize a variation in a voltage output over the limited frequency range 58. Having a sensor 10 with the proper number and dimensions of beam-mass pairs 14, 22 mounted to the frame 20, as well as the necessary electrode size $L_E$ and electrical connections 48, 50, can help tailor this variation in voltage output, in terms of magnitude and/or smoothness, over the frequency range 58 (e.g., magnitude with respect to range 58a, and smoothness with regard to range 58b). Resonant frequency placement and damping can be controlled to minimize the amount of ripple in the bandwidth or frequency range 58b of interest. The number of beams and the damping can control the ripple magnitude 62a-h. While it can be a challenge to simultaneously achieve a required sensor size, frequency range, and IRN, for instance in the auditory prosthesis realm, it is possible to improve the IRN by increasing sensitivity, which can be done in some embodiments, with a lower resonant frequency.

FIGS. 6-8 illustrate results from preliminary analytic studies, in which beam arrays 12 comprising ten parallel-connected beams 14 were shown to improve the IRN. FIGS. 6 and 7 show a sensitivity and phase comparison between a single resonance case 64 that would typically be designed to cover the frequency range 58 of interest. For the single resonance case 64, the ten beams are all 50 microns long and 100 microns wide, and each mass is 50 microns long, 100 microns tall, and 100 microns wide. The beams are connected in parallel. The comparison cases 66, 68 each have ten beams, each beam being 100 microns wide with the same mass dimensions as the single resonance case 64. However, with the multi-resonant comparison cases 66, 68, the shortest beam is 50 microns long and the longest beam is 950 microns (stepping up in increments of 100 microns). The comparison case 66 sums the outputs, whereas the comparison case 68 takes alternating sums and differences of the outputs. In the studies, a damping factor (e.g., 10% or 1−i*0.1) was used with the elastic properties to model damping. FIGS. 6 and 7 help illustrate that the multi-resonant comparison cases 66, 68 provide an increased sensitivity from about 0 to 8 kHz.

FIG. 8 illustrates the IRN comparison between the single resonance case 64 and the multi-resonant comparison cases 66, 68. For the auditory prosthesis application, the single resonance case 64 only achieves the required resolution above approximately 1 kHz. The multi-resonant comparison cases 66, 68 both also achieve the necessary IRN down to 100 Hz. The noise for the multi-resonant comparison cases 66, 68 was calculated by combining all of the capacitances in parallel. At 100 Hz, the summed case 66 is approximately 45 dB lower than the single resonance case 64. This is a significant improvement of the low-frequency IRN.

Further development of the preliminary analytic studies illustrated in FIGS. 6-8 involved increasing the number of beams in the beam array from ten to sixteen. The additional beams were included with dimensions that place the resonant frequencies in the gaps of the examples in FIGS. 6-8. The sixteen beams were 62.5 microns wide and still ranged from 50 to 950 microns long. Adding the extra beams, with the extra beams filling the resonant frequency gaps, helped smooth and decrease the sensitivity ripple or oscillation described above. Further, there was a significant improvement in IRN over the frequency range of interest.

FIGS. 11-13 illustrate additional results from preliminary analytic studies, in which beam arrays 12 comprised five parallel-connected beams 14 that are each 100 microns wide. In each of FIGS. 11-13, a reference sensor case 74 is compared with a summed case 76 and a difference case 78 (summed with alternating polarity). The difference case 78 illustrates a band-pass type bandwidth, and the summed case 76 is included, as with FIGS. 6-8, to illustrate the potential extension of the sensor bandwidth. The beams 14 increase in 50 micron length increments from 400 microns to 600 microns. They are completely electrode covered and identical in all remaining dimensions (including mass dimensions of 50 microns long, 100 microns wide, and 100 microns tall) and have 10% damping. The reference sensor case 74 is a 150 micron long, 500 micron wide beam with a 50 micron long, 500 micron wide, and 100 micron tall mass that is designed for a 3 dB bandwidth that is as large (or larger) than the bandwidth of the multi-resonant implementations. Typically, the sensors are designed with a bandwidth that is defined by the 3 dB point—the frequency at which the sensitivity has increased to 3 dB more than the low-frequency asymptote value. Over this range the sensor response is essentially linear. This demonstrates the highest sensitivity that could be achieved for a single-resonance sensor.

FIGS. 11-13 provide an example of what is theoretically illustrated in FIG. 5. The closely spaced resonant frequencies of each beam 14 in the beam array 12 help to smooth out the frequency response. The curve 78 would desirably have an extended range with minimized ripple over the resonant frequency region. The curve 76 illustrates a band of increased sensitivity that can be smoothed by the choice of resonant frequency location. Over this particular frequency band, the IRN will be decreased, which is advantageous.

FIGS. 14-16 also illustrate additional results from preliminary analytic studies, in which beam arrays 12 comprised five beams 14, as with FIGS. 11-13. However, in this example, overlap of the piezoelectric electrode layer 32 on the frame 20 at the base or anchored end 16 of each beam 14 was included, to serve as a stray capacitance that will decrease the voltage output from the sensor 10. Further, series connections of multiple electrodes on a surface of a subset of the beams were used to increase the voltage output (increase the sensitivity) of the beam 14. These tools can be used to smooth the ripple since the amplitude of the overall frequency response can be tuned, including the resonant frequency peak amplitude. The reference sensor case 84 is the same as in FIGS. 11-13, but both the summed case 86 and difference case 88 have a decreased voltage output generated by the beam, resulting from the overlap of the electrode materials on the top of the frame and/or mass. This allows for scaling of the sensitivity result. Additionally, these examples include series connections of two electrodes, although there could be more, on a single beam structure. This series connection increases the sensitivity, contributing to the result scaling.

It is to be understood that the foregoing description is of one or more preferred example embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment will become apparent to those skilled in the art. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A sensor, comprising:
   a frame;
   a beam array comprising a plurality of beams, wherein each beam of the plurality of beams has an anchored end and an unanchored end, wherein each beam is coupled to the frame at the anchored end; and
   a plurality of masses, wherein the unanchored end of each beam is coupled to a respective mass of the plurality of masses, wherein the beam array has a xylophonic shape, and wherein each mass has a mass thickness, and each mass thickness has a xylophonic variation that corresponds to the xylophonic shape of the beam array.

2. The sensor of claim 1, wherein each beam includes a cantilevered bimorph multi-layer structure.

3. The sensor of claim 2, wherein one or more beams of the plurality of beams includes an exposed body portion that is located between an electrode and the respective mass.

4. The sensor of claim 1, wherein a size of each mass of the plurality of masses correlates with a length of each beam of the plurality of beams.

5. The sensor of claim 1, wherein a center of gravity for each mass in the plurality of masses is vertically aligned with a neutral axis, lies above the neutral axis, or lies below the neutral axis of each beam of the plurality of beams.

6. The sensor of claim 1, wherein each beam of the plurality of beams is configured to minimize a variation in a voltage output for a limited frequency range.

7. The sensor of claim 1, wherein each beam of the plurality of beams has a resonant frequency, and the resonant frequency of each beam corresponds to a sensitivity peak in a limited frequency range.

8. The sensor of claim 1, wherein two or more beams of the plurality of beams have different resonant frequencies.

9. A sensor, comprising:
   a frame; and
   a beam array comprising a plurality of beams, wherein each beam of the plurality of beams has a resonant frequency, wherein the resonant frequency of each beam corresponds to a sensitivity peak in a limited frequency range, wherein each beam of the plurality of beams has an anchored end and an unanchored end, wherein each beam is coupled to the frame at the anchored end and a mass is coupled to each beam of the plurality of beams at the unanchored end, and wherein a size of each mass of the plurality of masses correlates with a length of each beam of the plurality of beams.

10. The sensor of claim 9, wherein each beam of the plurality of beams is configured to minimize a variation in a voltage output for the limited frequency range.

11. A sensor, comprising:
a frame; and
a beam array comprising a plurality of beams, wherein two or more beams of the plurality of beams have different resonant frequencies, wherein each beam of the plurality of beams has an anchored end and an unanchored end, wherein each beam is coupled to the frame at the anchored end and a mass is coupled to each beam of the plurality of beams at the unanchored end, and wherein a size of each mass of the plurality of masses correlates with a length of each beam of the plurality of beams.

12. The sensor of claim 11, wherein each beam of the plurality of beams has a resonant frequency and the resonant frequency of each beam corresponds to a sensitivity peak in a limited frequency range.

13. The sensor of claim 11, wherein each beam of the plurality of beams is configured to minimize a variation in a voltage output for a limited frequency range.

* * * * *